(12) United States Patent
Ahlf et al.

(10) Patent No.: US 11,149,349 B2
(45) Date of Patent: Oct. 19, 2021

(54) PROCESS FOR THE GENERATION OF THIN SILICON-CONTAINING FILMS

(71) Applicant: BASF SE, Ludwigshafen am Rhein (DE)

(72) Inventors: Maraike Ahlf, Ludwigshafen (DE); David Dominique Schweinfurth, Ludwigshafen (DE); Lukas Mayr, Ludwigshafen (DE); Kinga Izabela Leszczynska, Saarbrücken (DE); David Scheschkewitz, Saarbrücken (DE)

(73) Assignee: BASF SE, Ludwigshafen am Rhein (DE)

( * ) Notice: Subject to any disclaimer, the term of this patent is extended or adjusted under 35 U.S.C. 154(b) by 59 days.

(21) Appl. No.: 16/338,915

(22) PCT Filed: Oct. 18, 2017

(86) PCT No.: PCT/EP2017/076556
§ 371 (c)(1),
(2) Date: Apr. 2, 2019

(87) PCT Pub. No.: WO2018/077684
PCT Pub. Date: May 3, 2018

(65) Prior Publication Data
US 2019/0309417 A1 Oct. 10, 2019

(30) Foreign Application Priority Data
Oct. 25, 2016 (EP) ..................... 16195487

(51) Int. Cl.
C23C 16/455 (2006.01)
C23C 16/32 (2006.01)
(Continued)

(52) U.S. Cl.
CPC ...... *C23C 16/45553* (2013.01); *C23C 16/325* (2013.01); *C23C 16/345* (2013.01); *C23C 16/38* (2013.01); *C23C 16/401* (2013.01)

(58) Field of Classification Search
CPC .......... C23C 16/455523; C23C 16/325; C23C 16/38; C23C 16/401; C23C 16/345
See application file for complete search history.

(56) References Cited

U.S. PATENT DOCUMENTS 7,704,858 B2    4/2010  McSwiney et al.
2003/0108674 A1 6/2003 Chung et al.
(Continued)

FOREIGN PATENT DOCUMENTS

CN  103012457 A   4/2013
CN  103451619 A  12/2013
(Continued)

OTHER PUBLICATIONS

JP_2005170869_A_ Atsushi 200506, English translation (Year: 2005).*
(Continued)

*Primary Examiner* — Joseph A Miller, Jr.
(74) *Attorney, Agent, or Firm* — Armstrong Teasdale LLP

(57) ABSTRACT

The present invention is in the field of processes for the generation of thin inorganic films on substrates. In particular, the present invention relates to a process comprising depositing the compound of general formula (I) onto a solid substrate, wherein $R^1$, $R^2$, $R^3$, $R^4$, and $R^5$ is hydrogen, an alkyl group, an alkenyl group, an aryl group or a silyl group, wherein not more than three of $R^1$, $R^2$, $R^3$, $R^4$, and $R^5$ are hydrogen, X is a group which binds to silicon, m is 1 or 2, n is 0, 1, or 2, and Si is in the oxidation state +2.

(Continued)

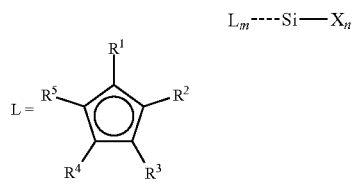

$$L_m\text{----}Si\text{---}X_n \quad (I)$$

9 Claims, 2 Drawing Sheets

(51) Int. Cl.
*C23C 16/34* (2006.01)
*C23C 16/38* (2006.01)
*C23C 16/40* (2006.01)

(56) References Cited

U.S. PATENT DOCUMENTS

| | | | |
|---|---|---|---|
| 2006/0068103 | A1 | 3/2006 | Machida et al. |
| 2009/0226612 | A1 | 9/2009 | Ogawa et al. |
| 2013/0078392 | A1 | 3/2013 | Xiao et al. |
| 2015/0087139 | A1 | 3/2015 | O'Neill et al. |
| 2015/0147871 | A1 | 5/2015 | Xiao et al. |
| 2016/0233098 | A1 | 8/2016 | Nabeya et al. |

FOREIGN PATENT DOCUMENTS

| | | | |
|---|---|---|---|
| CN | 104250258 | A | 12/2014 |
| CN | 104672265 | A | 6/2015 |
| JP | 2005-170869 | A | 6/2005 |
| JP | 2005170869 | * | 6/2005 |

OTHER PUBLICATIONS

Mix Organometallics 2010 V29 p. 442-447 (Year: 2010).*
International Search Report dated Dec. 15, 2017 in PCT/EP2017/076556 filed Oct. 18, 2017.
Jürgen Dahlhaus, et al., "(Me$_5$ C$_5$)SiH$_3$ and (Me$_5$ C$_5$)$_2$ SiH$_2$ as Precursors for Low-Temperature Remote Plasma-Enhanced CVD of Thin Si$_3$ N$_4$ and SiO$_2$ Films," Advanced Materials, vol. 5, No. 5, XP000368647, 1993, pp. 377-380.
A. L. Chistyakov, et al., "Sandwich complexes of Si, Ge, Sn, and Pb with cyclopentadienyl type derivatives of corannulene and fullerene C$_{60}$: stability estimates and molecular and electronic structure prediction by the MNDO/PM3 method," Russian Chemical Bulletin, vol. 48, No. 9, XP055362442, Sep. 1999, pp. 1628-1635.
Andreas Klipp, et al., "Novel cyclopentadienyl silanes and disilanes: synthesis, structure and gas-phase pyrolysis," Journal of Organometallic Chemistry, vol. 620, XP004317173, 2001, pp. 20-31.
Alastair F. Cuthbertson, et al., "The structure of silyl cyclopentadienes," Journal of Organometallic Chemistry, vol. 221, XP055362655, 1981, pp. 19-31.
Extended European Search Report dated May 22, 2017 in Patent Application No. 16195487.0.
Filippou, A.C. et al. "SiBr$_2$(Idipp): A Stable N-Heterocyclic Carbene Adduct of Dibromosilylene" Angewandte Chemie International Edition, Silicon Chemistry, vol. 48, No. 31, 2009, pp. 5687-5690.
Ghadwal, R.S. et al. "Lewis Base Stabilized Dichlorosilylene" Angewandte Chemie International Edition, Silicon Chemistry, vol. 48, No. 31, 2009, pp. 5683-5686.
Inoue, S. et al. "An Acyclic Imino-Substituted Silylene: Synthesis, Isolation, and its Facile Conversion into a Zwitterionic Silaimine" Angewandte Chemie International Edition, Silylene Compounds, vol. 51, No. 34, 2012, pp. 8589-8593.
Jutzi, P. et al. "[2,6-(Trip)$_2$H$_3$C$_6$](Cp*)Si: A Stable Monomeric Arylsilicon(II) Compound" Angewandte Chemie International Edition, Low-Coordinate Silicon, vol. 48, No. 14, 2006, pp. 2596-2599.
Jutzi, P. et al. "Decamethylsilicocene—Synthesis and Structure" Angewandte Chemie International Edition, vol. 25, No. 2, 1986, p. 164.
Jutzi, P. et al. "Novel π-complexes of divalent silicon: mixed substituted neutral sandwich compounds and the half-sandwich cation ($^i$Pr$_5$C$_5$)Si" Chemical Communications, No. 33, 2006, pp. 3519-3521.
Kessler, M. et al. "Synthesis and Structures of *ansa*-Titanocene Complexes with Diatomic Bridging Units for Overall Water Splitting" Chemistry-A European Journal, vol. 19, No. 20, 2013, pp. 6350-6357.
Schäfer, S. et al. "Investigations of the Nature of Zn$^{II}$—Si$^{II}$ Bonds" Chemistry-A European Journal, vol. 22, No. 21, 2016, pp. 7127-7133.
George, S.M. "Atomic Layer Deposition: An Overview" Chemical Reviews, vol. 110, No. 1, 2010, pp. 111-131.
Yang, J. et al. "Direct-liquid-evaporation chemical vapor deposition of smooth, highly conformal cobalt and cobalt nitride thin films" Journal of Materials Chemistry C, vol. 3, No. 46, 2015 pp. 12098-12106.
U.S. Appl. No. 15/316,661, filed Dec. 6, 2016, US2018-0187306, Maraike Ahlf.
U.S. Appl. No. 15/543,788, filed Jul. 14, 2017, US2018-0010249, Maraike Ahlf.
U.S. Appl. No. 15/559,497, filed Sep. 19, 2017, US2018-0119279, Maraike Ahlf.
U.S. Appl. No. 15/779,570, filed May 29, 2018, US2019-0144998, Falko Abels.
U.S. Appl. No. 16/076,808, filed Aug. 9, 2018, US2019/0018297, Michael Goebel.
U.S. Appl. No. 16/082,057, filed Sep. 4, 2018, US2019-0137838, Michael Goebel.
U.S. Appl. No. 16/082,013, filed Mar. 7, 2017, Daniel Waldmann.
U.S. Appl. No. 16/331,593, filed Mar. 8, 2019, David Dominique Schweinfurth.

* cited by examiner

PROCESS FOR THE GENERATION OF THIN SILICON-CONTAINING FILMS

The present invention is in the field of processes for the generation of thin silicon-containing films on substrates, in particular atomic layer deposition processes.

With the ongoing miniaturization, e.g. in the semiconductor industry, the need for thin inorganic films on substrates increases while the requirements of the quality of such films become stricter. Thin inorganic films serve different purposes such as barrier layers, dielectrics, conducting features, capping, or separation of fine structures. Several methods for the generation of thin inorganic films are known. One of them is the deposition of film forming compounds from the gaseous state on a substrate. Therefore, volatile precursors which can be deposited on a substrate and then be transformed into the desired composition in the film.

For silicon-containing thin films typically silicon halogenides, such as $Si_2Cl_6$, are used. However, these compounds are difficult to handle and often leave a significant amount of residual halogens in the film, which is undesirable for some applications.

JP 2005/170 869 A2 discloses a chemical vapor deposition process employing a silicocene compound in which each pentadienyl ligand bears one alkyl group. However, these compounds are so reactive that they can hardly be handled without decomposition and the obtained films are of insufficient quality.

Dahlhaus et al. disclose in Advanced Materials volume 5 (1993), page 377-380 the compounds $(Me_5C_5)SiH_3$ and $(Me_5C_5)_2SiH_2$ as precursors for plasma-enhanced CVD. However, these molecules are so stable that they can only be used under harsh conditions such as plasma-enhanced deposition which limits its applicability when high quality films are required.

It was an object of the present invention to provide a process for the generation of thin silicon-containing films with high quality, such as low amounts of impurities and uniform film thickness and composition. Furthermore, it was aimed at a process employing compounds, which can be synthesized and handled more easily. The process should also be flexible with regard to parameters such as temperature or pressure in order to be adaptable to various different applications.

These objects were achieved by a process comprising depositing the compound of general formula (I)

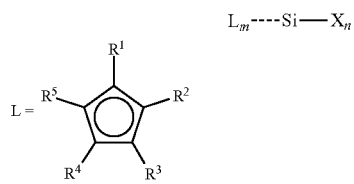

onto a solid substrate, wherein
$R^1$, $R^2$, $R^3$, $R^4$, and $R^5$ is hydrogen, an alkyl group, an alkenyl group, an aryl group or a silyl group, wherein not more than three of $R^1$, $R^2$, $R^3$, $R^4$, and $R^5$ are hydrogen,
X is a group which binds to silicon,
m is 1 or 2,
n is 0, 1, or 2, and
Si is in the oxidation state +2.

The present invention further relates to use of the compound of general formula (I), wherein $R^1$, $R^2$, $R^3$, $R^4$, and $R^5$ is hydrogen, an alkyl group, an alkenyl group, an aryl group or a silyl group, wherein not more than three of $R^1$, $R^2$, $R^3$, $R^4$, and $R^5$ are hydrogen,
X is a group which binds to silicon,
m is 1 or 2,
n is 0, 1, or 2, and
Si is in the oxidation state +2
for a film forming process.

The present invention further relates to a compound of general formula (I), wherein $R^1$, $R^2$, $R^3$, and $R^4$ are methyl, $R^5$ is hydrogen, an alkyl group other than methyl, an alkenyl group, an aryl group or a silyl group,
X is a group which binds to silicon,
m is 1 or 2,
n is 0, 1, or 2, and
Si is in the oxidation state +2.

The present invention further relates to a compound of general formula (Ia), wherein the compound of general formula (I) is a compound of general formula (Ia)

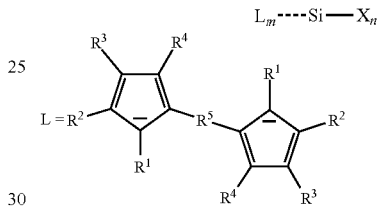

wherein
$R^1$, $R^2$, $R^3$, and $R^4$ is hydrogen, an alkyl group, an alkenyl group, an aryl group or a silyl group, wherein not more than three of $R^1$, $R^2$, $R^3$, $R^4$ are hydrogen,
$R^5$ is an alkyl group, an alkenyl group, an aryl group or a silyl group,
X is a group which binds to silicon,
m is 1 and
n is 0, 1, or 2.

Preferred embodiments of the present invention can be found in the description and the claims.

Combinations of different embodiments fall within the scope of the present invention.

The ligands L is an anionic ligand, which typically means that the ligand is an anion before coordinating to the silicon atom. Sometimes, the individual electron pairs are reflected in the formula, which then becomes general formula (I').

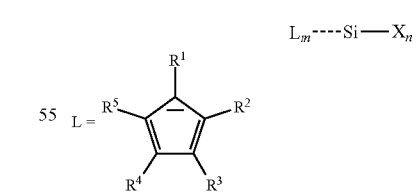

The ligand L is typically bound to the silicon atom via a $\eta^5$ bond which is indicated by the dotted line. If two ligands L are present in the compound of general formula (I), they can be the same or different to each other with regard to their substitution with $R^1$, $R^2$, $R^3$, $R^4$, and $R^5$. The silicon atom in the compound of general formula (I) is in the oxidation state +2. This typically corresponds to a compound of general formula (I) in which m+n is 2 or 3, in particular if two of L and X are anionic ligands and the remaining one if any is neutral, for example if m is 2 and n is 1, X is neutral while both L are anionic ligands.

In the compound of general formula (I) $R^1$, $R^2$, $R^3$, $R^4$, and $R^5$ are hydrogen, an alkyl group, an alkenyl group, an aryl group or a silyl group, wherein not more than three of $R^1$, $R^2$, $R^3$, $R^4$, and $R^5$ are hydrogen, preferably not more than two of $R^1$, $R^2$, $R^3$, $R^4$, and $R^5$ are hydrogen, more preferably not more than one of $R^1$, $R^2$, $R^3$, $R^4$, and $R^5$ is hydrogen, in particular $R^1$, $R^2$, $R^3$, $R^4$, and $R^5$ are an alkyl group, an alkenyl group, an aryl group or a silyl group. If three of $R^1$, $R^2$, $R^3$, $R^4$, and $R^5$ are hydrogen, preferably the remaining two are groups with branching at the atom which is attached to the cyclopentadienyl ring, wherein branching means that the atom attached to the cyclopentadienyl ring is bond to at least two non-hydrogen atoms. Examples for groups with branching at the atom which is attached to the cyclopentadienyl ring include an iso-propyl group, a phenyl group, or a trimethylsilyl group. Those $R^1$, $R^2$, $R^3$, $R^4$, and $R^5$ which are not hydrogen can be the same or different to each other.

An alkyl group can be linear or branched. Examples for a linear alkyl group are methyl, ethyl, n-propyl, n-butyl, n-pentyl, n-hexyl, n-heptyl, n-octyl, n-nonyl, n-decyl. Examples for a branched alkyl group are iso-propyl, iso-butyl, sec-butyl, tert-butyl, 2-methyl-pentyl, 2-ethyl-hexyl, cyclopropyl, cyclohexyl, indanyl, norbornyl. Preferably, the alkyl group is a $C_1$ to $C_8$ alkyl group, more preferably a $C_1$ to $C_6$ alkyl group, in particular a $C_1$ to $C_4$ alkyl group, such as methyl, ethyl, isopropyl or tert-butyl. Alkyl groups can be substituted, for example by halogens such as F, Cl, Br, I, in particular F, wherein perfluorated alkyl chains are particularly preferred, for example trifluormethyl, pentafluoroethyl, heptafluor-iso-propyl; by hydroxyl groups; by ether groups; or by amines such as dialkylamines.

An alkenyl group contains at least one carbon-carbon double bond. The double bond can include the carbon atom with which the alkenyl group is bound to the rest of the molecule, or it can be placed further away from the place where the alkenyl group is bound to the rest of the molecule, preferably it is placed further away from the place where the alkenyl group is bound to the rest of the molecule. Alkenyl groups can be linear or branched. Examples for linear alkenyl groups in which the double bond includes the carbon atom with which the alkenyl group is bound to the rest of the molecule include 1-ethenyl, 1-propenyl, 1-n-butenyl, 1-n-pentenyl, 1-n-hexenyl, 1-n-heptenyl, 1-n-octenyl. Examples for linear alkenyl groups in which the double bond is placed further away from the place where alkenyl group is bound to the rest of the molecule include 1-n-propen-3-yl, 2-buten-1-yl, 1-buten-3-yl, 1-buten-4-yl, 1-hexen-6-yl. Examples for branched alkenyl groups in which the double bond includes the carbon atom with which alkenyl group is bound to the rest of the molecule include 1-propen-2-yl, 1-n-buten-2-yl, 2-buten-2-yl, cyclopenten-1-yl, cyclohexen-1-yl. Examples for branched alkenyl groups in which the double bond is placed further away from the place where alkenyl group is bound to the rest of the molecule include 2-methyl-1-buten-4-yl, cyclopenten-3-yl, cyclohexene-3-yl. Examples for an alkenyl group with more than one double bonds include 1,3-butadien-1-yl, 1,3-butadien-2-yl, cylopentadien-5-yl. Preferably, the alkenyl group is a $C_1$ to $C_8$ alkenyl group, more preferably a $C_1$ to $C_6$ alkenyl group, in particular a $C_1$ to $C_4$ alkenyl group.

Aryl groups include aromatic hydrocarbons such as phenyl, naphthalyl, anthrancenyl, phenanthrenyl groups and heteroaromatic groups such as pyrryl, furanyl, thienyl, pyridinyl, quinolyl, benzofuryl, benzothiophenyl, thienothienyl. Several of these groups or combinations of these groups are also possible like biphenyl, thienophenyl or furanylthienyl. Aryl groups can be substituted for example by halogens like fluoride, chloride, bromide, iodide; by pseudohalogens like cyanide, cyanate, thiocyanate; by alcohols; alkyl groups; alkoxy groups; or aryl groups. Aromatic hydrocarbons are preferred, phenyl is more preferred.

A silyl group is a silicon atom with typically three substituents. Preferably a silyl group has the formula $SiE_3$, wherein E is independent of each other hydrogen, an alkyl group, an alkenyl group, an aryl group or a silyl group. It is possible that all three E are the same or that two E are the same and the remaining E is different or that all three E are different to each other. It is also possible that two E together form a ring including the Si atom. Alkyl and aryl groups are as described above. Examples for silyl groups include $SiH_3$, methylsilyl, trimethylsilyl, triethylsilyl, trin-propylsilyl, tri-iso-propylsilyl, tricyclohexylsilyl, dimethyl-tert-butylsilyl, dimethylcyclohexylsilyl, methyl-di-iso-propylsilyl, triphenylsilyl, phenylsilyl, dimethylphenylsilyl, pentamethyldisilyl.

It is possible that two of $R^1$, $R^2$, $R^3$, $R^4$, and $R^5$ form a ring together. This ring can be aliphatic or aromatic. An example in which two of $R^1$, $R^2$, $R^3$, $R^4$, and $R^5$ form an aromatic ring together is indole. Another example is fluorene, in which $R^1$ and $R^2$ together form an aromatic ring and at the same time $R^3$ and $R^4$ together form an aromatic ring.

It has been observed that a particularly high volatility of the compound of general formula (I) can be obtained if the cyclopentadienyl is unsymmetrically substituted, preferably $R^1$, $R^2$, $R^3$, and $R^4$ are methyl and $R^5$ is hydrogen, an alkyl group other than methyl, an alkenyl group, an aryl group or a silyl group, more preferably $R^1$, $R^2$, $R^3$, and $R^4$ are methyl and $R^5$ is hydrogen, an alkyl group other than methyl, in particular $R^1$, $R^2$, $R^3$, and $R^4$ are methyl and $R^5$ is ethyl, n-propyl, iso-propyl, n-butyl, sec-butyl, iso-butyl or tert-butyl.

According to the present invention, the compound of general formula (I) can only contain L as ligands, i.e. m is 2 and n is 0. These compounds are sometimes called homoleptic complexes. It is also possible that the compound of general formula (I) contains both L and X, i.e. m is 1 and n is 1 or 2, preferably 1. These compounds are sometimes called heteroleptic complexes. The ligands X and L are different to each other.

According to the present invention the ligand X in the compound of general formula (I) can be any ligand which binds to Si including hydride; halogens like fluoride, chloride, bromide or iodide; pseudohalogens like cyanide, isocyanide, cyanate, isocyanate, thiocyanate, isothiocyanate, or azide; alkyl groups like methyl, ethyl, butyl, or neopentyl anions; aryl groups like phenyl, 2,6-diisopropylphenyl, 2,4,6-trimethylphenyl, 2,4,6-triisopropylphenyl, 2,6-dimethoxyphenyl, 2,4,6-trimethoxyphenyl, 2,6-bisdimethylaminophenyl, 2,4,6-trisdimethylaminophenyl, 2,6-dipiperidylphenyl, 2,4,6-tripiperidylphenyl, 2,2,6,6-tetramethylpiperidinyl, 2,6-bis-(2,4,6-triisopropylphenyl)phenyl; or silicon bearing alkyl groups such as trimethylsilyl methyl.

Also, X can be a carbene ligand including N-heterocyclic carbenes such as N,N'-dialkylimidazol-2-ylidene, N,N'-diarylimidazol-2-ylidene, N,N'-dialkyl-4,5-dihydroimidazol-2-ylidene, or N,N'-diaryl-4,5-dihydroimidazol-2-ylidene; mesoionic carbenes such as 1,2,3-trialkylimidazolin-4-ylidene, 1,2,3-triarylimidazolin-4-ylidene, N,N'-dialkyl-5-aryl-1,2,3-triazol-4-ylidene N,N'-dialkyl-4-aryl-1,2,3-triazol-5-ylidene, 1,2,4,5-tetraalkylpyrazolin-3-ylidene, 1,2,4,5-tetraarylpyrazolin-3-ylidene, 1,2,3,5-tetraalkylpyrazolin-4-ylidene or 1,2,3,5-tetraarylpyrazolin-4-ylidene. Preferred examples for carbene ligands are N,N'-dimethylimidazol-2-ylidene, N,N'-diethylimidazol-2-ylidene, N,N'-di-n-propylimidazol-2-ylidene, N,N'-di-iso-propylimidazol-2-ylidene, N,N'-di-tert-butylimidazol-2-ylidene, 1,3,4,5-tetramethylimidazol-2-ylidene, N-methyl-N'-tert-butylimidazol-2-ylidene, N,N'-di-iso-propyl-4,5-dimethylimidazol-2-ylidene, N,N'-bis-(2,4,6-trimethylphenyl)imidazol-2-ylidene, N,N'-bis-(2,6-di-iso-propylphenyl)imidazol-2-ylidene.

Furthermore, X can be a ligand which binds to Si via a neutral or anionic nitrogen atom, for example by deprotonation before binding to Si. Such ligands include amine ligands in which the binding nitrogen atom is either aliphatic like in dialkylamine, piperidine, pyrrolidine, morpholine, alkylsilylamines such as hexamethyldisilazane or trimethylsilyl tertbutylamine, arylsilylamines such as trimethylsilyl 2,6-diisopropylphenylamine; or aromatic like in pyrrole, indole, pyridine, 4-dimethylaminopyridine, or pyrazine. Further ligands which bind via a nitrogen atom include imine ligands such as acetoneimine, diphenylketimine, or N,N'-bis(2,6-diisopropylphenyl)imidazoloneimine; Preferably, X is a ligand which binds via at least two neutral or anionic nitrogen atoms. These include amidinates such as acetamidine, N,N'-bis-iso-propylacetamidine, N,N'-bis-tert-butylacetamidine, N,N'-bis-iso-propylbenzoic amidine, N,N'-bis-tert-butylbenzoic amidine, N,N'-bis-iso-propyl-neo-pentanoic amidine, N,N'-bis-tert-butyl-neo-pentanoic amidine; guanidinates such as guanidine; aminoimines such as 2-N-tert-butylamino-2-methylpropanal-N-tertbuylimine; diimines such as glyoxal-N,N'-bis-isopropyl-diimine, glyoxal-N,N'-bis-tert-butyldiimine or 2,4-pentanedione-diimine; diketiminates such as N,N'-2,4-pentanediketimi-nate; iminopyrroles including pyrrol-2-carbald-alkylimines such as pyrrol-2-carbald-ethylimine, pyrrol-2-carbald-iso-propylimine or pyrrol-2-carbald-tert-butylimine as well as pyrrol-2,5-biscarbald-alkyldiimines such as pyrrol-2,5-biscarbald-tert-butyldiimine.

It is also possible that X is a ligand in which an oxygen atom binds to Si. Examples are alkanolates, tetrahydrofurane, acetylacetonate, or 1,1,1,5,5,5-pentafluoroacetylacetone. Other suitable examples for X include both a nitrogen and an oxygen atom which both bind to or coordinate Si including dimethylamino-iso-propanol, formamide, acetamide, 2,4-pentandione-N-alkylamines such as 2,4-pentandione-N-iso-propylimine.

Preferably, the ligand X is an aryl group, an amine, an imine, or an amidine. More preferably, the ligand X is 2,6-diisopropylphenyl, 2,2,6,6-tetramethylpiperidinyl, 2,4,6-trimethylphenyl, 2,4,6-triisopropylphenyl, 2,6-dimethoxyphenyl, 2,4,6-trimethoxyphenyl, 2,6-bis-(2,4,6-triisopropylphenyl)phenyl, 2,6-bisdimethylaminophenyl, 2,4,6-trisdimethylaminophenyl, 2,6-dipiperidylphenyl, 2,4,6-tripiperidylphenyl, di-tert-butylamine, bis(trimethylsilyl)amine, tert-butyl-trimethylsilylamine, 1,3-Bis(2,6-diisopropylphenyl)-1,3-dihyro-imidazol-2-imine, N,N'-di-iso-propylacetamidine, N,N'-di-tert-butylacetamidine, N,N'-di-iso-propyl-neopentanoic amidine, N,N'-di-tertbutyl-neopentanoic amidine, N,N'-di-iso-propyl-benzoic amidine, N,N'-di-tert-butyl-benzoic amidine.

It is preferred that the molecular weight of the compound of general formula (I) is up to 1000 g/mol, more preferred up to 800 g/mol, in particular up to 600 g/mol.

Some preferred examples for compounds of general formula (I) are given in the following table. If two different entries for in one column are given, this refers to two different L or X.

| No. | $R^1$ | $R^2$ | $R^3$ | $R^4$ | $R^5$ | m | X | n |
|---|---|---|---|---|---|---|---|---|
| C-1 | Me | Me | Me | Me | Me | 2 | — | 0 |
| C-2 | Me | Me | Me | Me | Me | 2 | — | 0 |
|  | i-Pr | i-Pr | i-Pr | i-Pr | i-Pr |  |  |  |
| C-3 | Me | Me | Me | Me | Me | 2 | — | 0 |
|  | TMS | H | TMS | H | H |  |  |  |
| C-4 | Me | Me | Me | Me | Me | 2 | — | 0 |
|  | Me | H | Me | Me | H |  |  |  |
| C-5 | Me | H | Me | Me | H | 2 | — | 0 |
| C-6 | Me | Me | Me | Me | Et | 2 | — | 0 |
| C-7 | Me | Me | Me | Me | n-Pr | 2 | — | 0 |
| C-8 | Me | Me | Me | Me | i-Pr | 2 | — | 0 |
| C-9 | Me | Me | Me | Me | n-Bu | 2 | — | 0 |
| C-10 | Me | Me | Me | Me | $SiMe_3$ | 2 | — | 0 |
| C-11 | Me | Me | Me | Me | H | 2 | — | 0 |
| C-12 | Me | Me | Me | Me | Me | 1 | cp | 1 |
| C-13 | Me | Me | Me | Me | Me | 1 | $N(SiMe_3)Dip$ | 1 |
| C-14 | Me | Me | Me | Me | Me | 1 | Tmp | 1 |
| C-15 | Me | Me | Me | Me | Me | 1 | $N(t-Bu)_2$ | 1 |
| C-16 | Et | Et | Et | Et | Et | 1 | $N(SiMe_3)_2$ | 1 |
| C-17 | Et | Et | Et | Et | Et | 1 | Tmp | 1 |
| C-18 | Et | Et | Et | Et | Et | 1 | $N(t-Bu)_2$ | 1 |
| C-19 | i-Pr | i-Pr | i-Pr | i-Pr | i-Pr | 1 | $N(SiMe_3)_2$ | 1 |
| C-20 | i-Pr | i-Pr | i-Pr | i-Pr | i-Pr | 1 | Tmp | 1 |
| C-21 | i-Pr | i-Pr | i-Pr | i-Pr | i-Pr | 1 | $N(t-Bu)_2$ | 1 |
| C-22 | Me | Me | Me | Me | Me | 1 | Mes | 1 |
| C-23 | Me | Me | Me | Me | Me | 1 | Dip | 1 |
| C-24 | Me | Me | Me | Me | Me | 1 | Tip | 1 |
| C-25 | Me | Me | Me | Me | Me | 1 | Dmop | 1 |
| C-26 | Me | Me | Me | Me | Me | 1 | Tmop | 1 |
| C-27 | Me | Me | Me | Me | Me | 1 | Dmap | 1 |
| C-28 | Me | Me | Me | Me | Me | 1 | Tmap | 1 |
| C-29 | Me | Me | Me | Me | Me | 1 | Dpip | 1 |
| C-30 | Me | Me | Me | Me | Me | 1 | Tpip | 1 |
| C-31 | Et | Et | Et | Et | Et | 1 | Mes | 1 |
| C-32 | Et | Et | Et | Et | Et | 1 | Dip | 1 |

-continued

| No. | R¹ | R² | R³ | R⁴ | R⁵ | m | X | n |
|---|---|---|---|---|---|---|---|---|
| C-33 | Et | Et | Et | Et | Et | 1 | Tip | 1 |
| C-34 | Et | Et | Et | Et | Et | 1 | Dmop | 1 |
| C-35 | Et | Et | Et | Et | Et | 1 | Tmop | 1 |
| C-36 | Et | Et | Et | Et | Et | 1 | Dmap | 1 |
| C-37 | Et | Et | Et | Et | Et | 1 | Tmap | 1 |
| C-38 | Et | Et | Et | Et | Et | 1 | Dpip | 1 |
| C-39 | Et | Et | Et | Et | Et | 1 | Tpip | 1 |
| C-40 | i-Pr | i-Pr | i-Pr | i-Pr | i-Pr | 1 | Mes | 1 |
| C-41 | i-Pr | i-Pr | i-Pr | i-Pr | i-Pr | 1 | Dip | 1 |
| C-42 | i-Pr | i-Pr | i-Pr | i-Pr | i-Pr | 1 | Tip | 1 |
| C-43 | i-Pr | i-Pr | i-Pr | i-Pr | i-Pr | 1 | Dmop | 1 |
| C-44 | i-Pr | i-Pr | i-Pr | i-Pr | i-Pr | 1 | Tmop | 1 |
| C-45 | i-Pr | i-Pr | i-Pr | i-Pr | i-Pr | 1 | Dmap | 1 |
| C-46 | i-Pr | i-Pr | i-Pr | i-Pr | i-Pr | 1 | Tmap | 1 |
| C-47 | i-Pr | i-Pr | i-Pr | i-Pr | i-Pr | 1 | Dpip | 1 |
| C-48 | i-Pr | i-Pr | i-Pr | i-Pr | i-Pr | 1 | Tpip | 1 |
| C-49 | Me | Me | Me | Me | Me | 1 | Im-Dip | 1 |
| C-50 | Me | Me | Me | Me | Me | 1 | MeC(N—t-Bu)$_2$ | 1 |
| C-51 | Me | Me | Me | Me | Me | 1 | PhC(N—t-Bu)$_2$ | 1 |
| C-52 | Me | Me | Me | Me | Me | 1 | PhC(N—i-Pr)$_2$ | 1 |
| C-53 | Me | Me | Me | Me | Me | 1 | MeC(N—t-Bu)$_2$ | 1 |
| C-54 | Me | Me | Me | Me | Me | 1 | MeC(N—i-Pr)$_2$ | 1 |
| C-55 | Me | Me | Me | Me | Me | 1 | t-BuC(N—t-Bu)$_2$ | 1 |
| C-56 | Me | Me | Me | Me | Me | 1 | t-BuC(N—i-Pr)$_2$ | 1 |
| C-57 | Me | Me | Me | Me | Et | 1 | PhC(N—t-Bu)$_2$ | 1 |
| C-58 | Me | Me | Me | Me | Et | 1 | PhC(N—i-Pr)$_2$ | 1 |
| C-59 | Me | Me | Me | Me | Et | 1 | MeC(N—t-Bu)$_2$ | 1 |
| C-60 | Me | Me | Me | Me | Et | 1 | MeC(N—i-Pr)$_2$ | 1 |
| C-61 | Me | Me | Me | Me | Et | 1 | t-BuC(N—t-Bu)$_2$ | 1 |
| C-62 | Me | Me | Me | Me | Et | 1 | t-BuC(N—i-Pr)$_2$ | 1 |
| C-63 | Me | Me | Me | Me | n-Pr | 1 | PhC(N—t-Bu)$_2$ | 1 |
| C-64 | Me | Me | Me | Me | n-Pr | 1 | PhC(N—i-Pr)$_2$ | 1 |
| C-65 | Me | Me | Me | Me | n-Pr | 1 | MeC(N—t-Bu)$_2$ | 1 |
| C-66 | Me | Me | Me | Me | n-Pr | 1 | MeC(N—i-Pr)$_2$ | 1 |
| C-67 | Me | Me | Me | Me | n-Pr | 1 | t-BuC(N—t-Bu)$_2$ | 1 |
| C-68 | Me | Me | Me | Me | n-Pr | 1 | t-BuC(N—i-Pr)$_2$ | 1 |
| C-69 | Me | Me | Me | Me | i-Pr | 1 | PhC(N—t-Bu)$_2$ | 1 |
| C-70 | Me | Me | Me | Me | i-Pr | 1 | PhC(N—i-Pr)$_2$ | 1 |
| C-71 | Me | Me | Me | Me | i-Pr | 1 | MeC(N—t-Bu)$_2$ | 1 |
| C-72 | Me | Me | Me | Me | i-Pr | 1 | MeC(N—i-Pr)$_2$ | 1 |
| C-73 | Me | Me | Me | Me | i-Pr | 1 | t-BuC(N—t-Bu)$_2$ | 1 |
| C-74 | Me | Me | Me | Me | i-Pr | 1 | t-BuC(N—i-Pr)$_2$ | 1 |
| C-75 | Me | Me | Me | Me | n-Bu | 1 | PhC(N—t-Bu)$_2$ | 1 |
| C-76 | Me | Me | Me | Me | n-Bu | 1 | PhC(N—i-Pr)$_2$ | 1 |
| C-77 | Me | Me | Me | Me | n-Bu | 1 | MeC(N—t-Bu)$_2$ | 1 |
| C-78 | Me | Me | Me | Me | n-Bu | 1 | MeC(N—i-Pr)$_2$ | 1 |
| C-79 | Me | Me | Me | Me | n-Bu | 1 | t-BuC(N—t-Bu)$_2$ | 1 |
| C-80 | Me | Me | Me | Me | n-Bu | 1 | t-BuC(N—i-Pr)$_2$ | 1 |
| C-81 | Me | Me | Me | Me | H | 1 | PhC(N—t-Bu)$_2$ | 1 |
| C-82 | Me | Me | Me | Me | H | 1 | PhC(N—i-Pr)$_2$ | 1 |
| C-83 | Me | Me | Me | Me | H | 1 | MeC(N—t-Bu)$_2$ | 1 |
| C-84 | Me | Me | Me | Me | H | 1 | MeC(N—i-Pr)$_2$ | 1 |
| C-85 | Me | Me | Me | Me | H | 1 | t-BuC(N—t-Bu)$_2$ | 1 |
| C-86 | Me | Me | Me | Me | H | 1 | t-BuC(N—i-Pr)$_2$ | 1 |
| C-87 | Me | Me | Me | Me | SiMe$_3$ | 1 | PhC(N—t-Bu)$_2$ | 1 |
| C-88 | Me | Me | Me | Me | SiMe$_3$ | 1 | PhC(N—i-Pr)$_2$ | 1 |
| C-89 | Me | Me | Me | Me | SiMe$_3$ | 1 | MeC(N—t-Bu)$_2$ | 1 |
| C-90 | Me | Me | Me | Me | SiMe$_3$ | 1 | MeC(N—i-Pr)$_2$ | 1 |
| C-91 | Me | Me | Me | Me | SiMe$_3$ | 1 | t-BuC(N—t-Bu)$_2$ | 1 |
| C-92 | Me | Me | Me | Me | SiMe$_3$ | 1 | t-BuC(N—i-Pr)$_2$ | 1 |
| C-93 | Me | Me | Me | Me | Me | 1 | N(SiMe$_3$)$_2$ | 1 |
| C-94 | Me | Me | Me | Me | H | 1 | N(SiMe$_3$)$_2$ | 1 |
| C-95 | Me | Me | Me | Me | Et | 1 | N(SiMe$_3$)$_2$ | 1 |
| C-96 | Me | Me | Me | Me | n-Pr | 1 | N(SiMe$_3$)$_2$ | 1 |
| C-97 | Me | Me | Me | Me | i-Pr | 1 | N(SiMe$_3$)$_2$ | 1 |
| C-98 | Me | Me | Me | Me | n-Bu | 1 | N(SiMe$_3$)$_2$ | 1 |
| C-99 | Me | Me | Me | Me | SiMe$_3$ | 1 | N(SiMe$_3$)$_2$ | 1 |
| C-100 | Me | Me | Me | Me | Me | 1 | BTP | 1 |
| C-101 | CF$_3$ | CF$_3$ | CF$_3$ | CF$_3$ | CF$_3$ | 2 | — | 0 |
| C-102 | Me | Me | Me | Me | CF$_3$ | 2 | — | 0 |
| C-103 | Me | Me | Me | Me | C$_2$F$_5$ | 2 | — | 0 |
| C-104 | Me | Me | Me | Me | n-C$_3$F$_7$ | 2 | — | 0 |
| C-105 | Me | Me | Me | Me | i-C$_3$F$_7$ | 2 | — | 0 |
| C-106 | Me | Me | Me | Me | Me | 1 | N(SiMe$_3$)$_2$ ImMe$_4$ | 2 |

Me stands for methyl, Et for ethyl, i-Pr for iso-propyl, t-Bu for tert-butyl, TMS for trimethylsilyl, cp for cyclopentadiene, Dip for 2,6-diisopropylphenyl, Tmp for 2,2,6,6-tetramethylpiperidinyl, Mes for 2,4,6-trimethylphenyl, Tip for 2,4,6-triisopropylphenyl, Dmop for 2,6-dimethoxyphenyl, Tmop for 2,4,6-trimethoxyphenyl, Dmap for 2,6-bisdimethylaminophenyl, Tmap for 2,4,6-trisdimethylaminophenyl, Dpip for 2,6-dipiperidylphenyl, Tpip for 2,4,6-tripiperidylphenyl, Im-Dip for 1,3-Bis(2,6-diisopropylphenyl)-1,3-dihyro-imidazol-2-imine, MeC(N-i-Pr)$_2$ for N,N'-di-iso-propylacetamidine, MeC(N-t-Bu)$_2$ for N,N'-di-tert-butylacetamidine, t-BuC(N-i-Pr)$_2$ for N,N'-di-iso-propyl-neo-pentanoic amidine, t-BuC(N-t-Bu)$_2$ for N,N'-di-tert-butyl-neo-pentanoic amidine, PhC(N-i-Pr)$_2$ for N,N'-di-iso-propyl-benzoic amidine, PhC(N-t-Bu)$_2$ for N,N'-di-tert-butyl-benzoic amidine, BTP for 2,6-bis-(2,4,6-triisopropylphenyl)phenyl, Im-Mea for 1,2,3,4-tetramethyl-1,3-dihyro-imidazol-2-imine.

The synthesis of compounds of general formula (I) is described for example by Jutzi et al. in Angewandte Chemie International Edition, volume 25 (1986), page 164 or in Chemical Communications 2006, page 3519 or by Schafer et al. in Chemistry—A European Journal, volume 22 (2016) page 7127 to 7133 or by Jutzi et al. in Angewandte Chemie International Edition, volume 48 (2009) page 2596 to 2599 or by Inoue et al. in Angewandte Chemie International Edition, volume 51 (2012) page 8589 to 8593.

Preferably in the compound of general formula (I) $R^5$ is substituted by a cyclopentadienyl group. In this case, the compound of general formula (I) is referred to as compound of general formula (Ia).

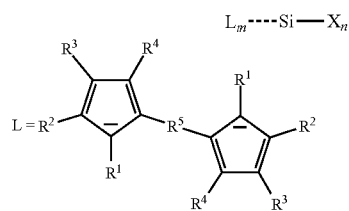

(Ia)

The different $R^1$, $R^2$, $R^3$ and $R^4$ can be the same or different to each other, preferably they are the same. Preferably, in the compound of general formula (Ia), m is 1 and n is 0. Preferably, $R^5$ in the compound of general formula (Ia) is an alkyl or silyl group, in particular an alkyl group having one, two or three carbon atoms or a siliyl group having one, two or three silicon atoms. Some preferred examples are given in the table below.

| No. | $R^1$ | $R^2$ | $R^3$ | $R^4$ | $R^5$ | m | X | n |
|---|---|---|---|---|---|---|---|---|
| C-a-1 | Me | Me | Me | Me | —SiMe$_2$—SiMe$_2$— | 1 | — | 0 |
| C-a-2 | Me | Me | Me | Me | —SiMe$_2$—SiMe$_2$— | 1 | — | 0 |
| | i-Pr | i-Pr | i-Pr | i-Pr | | | | |
| C-a-3 | Me | Me | Me | Me | —SiMe$_2$—SiMe$_2$— | 1 | — | 0 |
| | TMS | H | TMS | H | | | | |
| C-a-4 | Me | Me | Me | Me | —SiMe$_2$—SiMe$_2$— | 1 | — | 0 |
| | Me | H | Me | Me | | | | |
| C-a-5 | Me | H | Me | Me | —SiMe$_2$—SiMe$_2$— | 1 | — | 0 |
| C-a-6 | Me | Me | Me | Me | —SiMe$_2$— | 1 | — | 0 |
| C-a-7 | Me | Me | Me | Me | —SiMe$_2$— | 1 | — | 0 |
| | i-Pr | i-Pr | i-Pr | i-Pr | | | | |
| C-a-8 | Me | Me | Me | Me | —SiMe$_2$— | 1 | — | 0 |
| | TMS | H | TMS | H | | | | |
| C-a-9 | Me | Me | Me | Me | —SiMe$_2$— | 1 | — | 0 |
| | Me | H | Me | Me | | | | |
| C-a-10 | Me | H | Me | Me | —SiMe$_2$— | 1 | — | 0 |
| C-a-11 | Me | Me | Me | Me | —CH$_2$—CH$_2$— | 1 | — | 0 |
| C-a-12 | Me | Me | Me | Me | —CH$_2$—CH$_2$— | 1 | — | 0 |
| | i-Pr | i-Pr | i-Pr | i-Pr | | | | |
| C-a-13 | Me | Me | Me | Me | —CH$_2$—CH$_2$— | 1 | — | 0 |
| | TMS | H | TMS | H | | | | |
| C-a-14 | Me | Me | Me | Me | —CH$_2$—CH$_2$— | 1 | — | 0 |
| | Me | H | Me | Me | | | | |
| C-a-15 | Me | H | Me | Me | —CH$_2$—CH$_2$— | 1 | — | 0 |
| C-a-16 | Me | Me | Me | Me | —CH$_2$— | 1 | — | 0 |
| C-a-17 | Me | Me | Me | Me | —CH$_2$— | 1 | — | 0 |
| | i-Pr | i-Pr | i-Pr | i-Pr | | | | |
| C-a-18 | Me | Me | Me | Me | —CH$_2$— | 1 | — | 0 |
| | TMS | H | TMS | H | | | | |
| C-a-19 | Me | Me | Me | Me | —CH$_2$— | 1 | — | 0 |
| | Me | H | Me | Me | | | | |
| C-a-20 | Me | H | Me | Me | —CH$_2$— | 1 | — | 0 |
| C-a-21 | Me | Me | Me | Me | —CH$_2$—CH$_2$—CH$_2$ | 1 | — | 0 |
| C-a-22 | Me | Me | Me | Me | —CH$_2$—CH$_2$—CH$_2$ | 1 | — | 0 |
| | i-Pr | i-Pr | i-Pr | i-Pr | | | | |
| C-a-23 | Me | Me | Me | Me | —CH$_2$—CH$_2$—CH$_2$ | 1 | — | 0 |
| | TMS | H | TMS | H | | | | |
| C-a-24 | Me | Me | Me | Me | —CH$_2$—CH$_2$—CH$_2$ | 1 | — | 0 |
| | Me | H | Me | Me | | | | |
| C-a-25 | Me | H | Me | Me | —CH$_2$—CH$_2$—CH$_2$ | 1 | — | 0 |

The abbreviations have the same meaning as in the former table.

The compound of general formula (Ia) can be synthesized for example by reacting NHC—SiBr$_2$ as described by A. C. Filippou et al. in Angewandte Chemie International Edition, volume 48 (2009), page 5687-5690 with a dianion of ligand L.

The compound of general formula (I) used in the process according to the present invention is preferably used at high purity to achieve best results. High purity means that the substance employed contains at least 90 wt.-% compound of general formula (I), preferably at least 95 wt.-% compound of general formula (I), more preferably at least 98 wt.-% compound of general formula (I), in particular at least 99 wt.-% compound of general formula (I). The purity can be determined by elemental analysis according to DIN 51721 (Prüfung fester Brennstoffe—Bestimmung des Gehaltes an Kohlenstoff and Wasserstoff—Verfahren nach Radmacher-Hoverath, August 2001).

The compound of general formula (I) can be deposited from the gaseous or aerosol state. It can be brought into the gaseous or aerosol state by heating it to elevated temperatures. In any case a temperature below the decomposition temperature of the compound of general formula (I) has to be chosen. Preferably, the heating temperature ranges from slightly above room temperature to 400° C., more preferably from 30° C. to 300° C., even more preferably from 40° C. to 250° C., in particular from 50° C. to 200° C.

Another way of bringing the compound of general formula (I) into the gaseous or aerosol state is direct liquid injection (DLI) as described for example in US 2009/0226612 A1. In this method the compound of general formula (I) is typically dissolved in a solvent and sprayed in a carrier gas or vacuum. Depending on the vapor pressure of the compound of general formula (I), the temperature and the pressure the compound of general formula (I) is either brought into the gaseous state or into the aerosol state. Various solvents can be used provided that the compound of general formula (I) shows sufficient solubility in that solvent such as at least 1 g/l, preferably at least 10 g/l, more preferably at least 100 g/l. Examples for these solvents are coordinating solvents such as tetrahydrofuran, dioxane, diethoxyethane, pyridine or non-coordinating solvents such as hexane, heptane, benzene, toluene, or xylene. Solvent mixtures are also suitable. The aerosol comprising the compound of general formula (I) should contain very fine liquid droplets or solid particles. Preferably, the liquid droplets or solid particles have a weight average diameter of not more than 500 nm, more preferably not more than 100 nm. The weight average diameter of liquid droplets or solid particles can be determined by dynamic light scattering as described in ISO 22412:2008. It is also possible that a part of the compound of general formula (I) is in the gaseous state and the rest is in the aerosol state, for example due to a limited vapor pressure of the compound of general formula (I) leading to partial evaporation of the compound of general formula (I) in the aerosol state.

Alternatively, the metal-containing compound can be brought into the gaseous state by direct liquid evaporation (DLE) as described for example by J. Yang et al. (Journal of Materials Chemistry C, volume 3 (2015) page 12098-12106). In this method, the metal-containing compound or the reducing agent is mixed with a solvent, for example a hydrocarbon such as tetradecane, and heated below the boiling point of the solvent. By evaporation of the solvent, the metal-containing compound or the reducing agent is brought into the gaseous state. This method has the advantage that no particulate contaminants are formed on the surface.

It is preferred to bring the compound of general formula (I) into the gaseous or aerosol state at decreased pressure. In this way, the process can usually be performed at lower heating temperatures leading to decreased decomposition of the compound of general formula (I).

It is also possible to use increased pressure to push the compound of general formula (I) in the gaseous or aerosol state towards the solid substrate. Often, an inert gas, such as nitrogen or argon, is used as carrier gas for this purpose. Preferably, the pressure is 10 bar to $10^{-7}$ mbar, more preferably 1 bar to $10^{-3}$ mbar, in particular 10 to 0.1 mbar, such as 1 mbar.

It is also possible that the compound of general formula (I) is deposited or brought in contact with the solid substrate from solution. Deposition from solution is advantageous for compounds which are not stable enough for evaporation. However, the solution needs to have a high purity to avoid undesirable contaminations on the surface. Deposition from solution usually requires a solvent which does not react with the compound of general formula (I). Examples for solvents are ethers like diethyl ether, methyl-tert-butylether, tetrahydrofurane, 1,4-dioxane; ketones like acetone, methylethylketone, cyclopentanone; esters like ethyl acetate; lactones like 4-butyrolactone; organic carbonates like diethylcarbonate, ethylene carbonate, vinylenecarbonate; aromatic hydrocarbons like benzene, toluene, xylene, mesitylene, ethylbenzene, styrene; aliphatic hydrocarbons like n-pentane, n-hexane, n-octane, cyclohexane, iso-undecane, decaline, hexadecane. Ethers are preferred, in particular diethylether, methyl-tert-butyl-ether, tetrahydrofurane, and 1,4-dioxane. The concentration of the compound of general formula (I) depend among others on the reactivity and the desired reaction time. Typically, the concentration is 0.1 mmol/l to 10 mol/l, preferably 1 mmol/l to 1 mol/l, in particular 10 to 100 mmol/l. The reaction temperature for solution deposition is typically lower than for deposition from the gaseous or aerosol phase, typically 20 to 150° C., preferably 50 to 120° C., in particular 60 to 100° C.

The deposition takes place if the substrate comes in contact with the compound of general formula (I). Generally, the deposition process can be conducted in two different ways: either the substrate is heated above or below the decomposition temperature of the compound of general formula (I). If the substrate is heated above the decomposition temperature of the compound of general formula (I), the compound of general formula (I) continuously decomposes on the surface of the solid substrate as long as more compound of general formula (I) in the gaseous or aerosol state reaches the surface of the solid substrate. This process is typically called chemical vapor deposition (CVD). Usually, an inorganic layer of homogeneous composition, e.g. the metal oxide or nitride, is formed on the solid substrate as the organic material is desorbed from the metal M. Typically the solid substrate is heated to a temperature in the range of 300 to 1000° C., preferably in the range of 350 to 600° C.

Alternatively, the substrate is below the decomposition temperature of the metal-containing compound. Typically, the solid substrate is at a temperature equal to or slightly above the temperature of the place where the metal-containing compound is brought into the gaseous state, often at room temperature or only slightly above. Preferably, the temperature of the substrate is 5° C. to 40° C. higher than the place where the metal-containing compound is brought into the gaseous state, for example 20° C. Preferably, the temperature of the substrate is from room temperature to 600° C., more preferably from 100 to 450° C., such as 150 to 350° C., for example 220° C. or 280° C.

The deposition of compound of general formula (I) onto the solid substrate is either a physisorption or a chemisorption process. Preferably, the compound of general formula (I) is chemisorbed on the solid substrate. One can determine if the compound of general formula (I) chemisorbs to the solid substrate by exposing a quartz microbalance with a quartz crystal having the surface of the substrate in question to the compound of general formula (I) in the gaseous or aerosol state. The mass increase is recorded by the eigenfrequency of the quartz crystal. Upon evacuation of the chamber in which the quartz crystal is placed the mass should not decrease to the initial mass, but about a monolayer of the residual compound of general formula (I) remains if chemisorption has taken place. In most cases where chemisorption of the compound of general formula (I) to the solid substrate occurs, the X-ray photoelectron spectroscopy (XPS) signal (ISO 13424 EN—Surface chemical analysis—X-ray photoelectron spectroscopy—Reporting of results of thin-film analysis; October 2013) of M changes due to the bond formation to the substrate.

If the temperature of the substrate in the process according to the present invention is kept below the decomposition temperature of the compound of general formula (I), typically a monolayer is deposited on the solid substrate. Once a molecule of general formula (I) is deposited on the solid substrate further deposition on top of it usually becomes less likely. Thus, the deposition of the compound of general formula (I) on the solid substrate preferably represents a self-limiting process step. The typical layer thickness of a self-limiting deposition processes step is from 0.005 to 1 nm, preferably from 0.01 to 0.5 nm, more preferably from 0.02 to 0.4 nm, in particular from 0.05 to 0.2 nm. The layer thickness is typically measured by ellipsometry as described in PAS 1022 DE (Referenzverfahren zur Bestimmung von optischen and dielektrischen Materialeigenschaften sowie der Schichtdicke dünner Schichten mittels Ellipsometrie; February 2004).

Often it is desired to build up thicker layers than those just described. In order to achieve this in the process according to the present invention it is preferable to decompose the deposited compound of general formula (I) by removal of all ligands after which further compound of general formula (I) is deposited. This sequence is preferably performed at least twice, more preferably at least 10 times, in particular at least 50 times. Normally, the sequence is performed not more than 1000 times. Removing all ligands in the context of the present invention means that not more than 10 wt.-% of the carbon present in the deposited compound of general formula (I) remains in the deposited layer on the solid substrate, more preferably not more than 5 wt.-%, in particular not more than 1 wt.-%. The decomposition can be effected in various ways. The temperature of the solid substrate can be increased above the decomposition temperature.

Furthermore, it is possible to expose the deposited compound of general formula (I) to a plasma like an oxygen plasma, hydrogen plasma or ammonia plasma; to oxidants like oxygen, oxygen radicals, ozone, nitrous oxide ($N_2O$), nitric oxide (NO), nitrogendioxde ($NO_2$) or hydrogen peroxide; to ammonia or ammonia derivatives for example tert-butylamine, iso-propylamine, dimethylamine, methylethylamine, or diethylamine; to hydrazine or hydrazine derivatives like N,N-dimethylhydrazine; to solvents like water, alkanes, or tetrachlorocarbon; or to boron compound like borane. The choice depends on the chemical structure of the desired layer. For silicon oxide, it is preferable to use oxidants, plasma or water, in particular water, oxygen plasma or ozone. For silicon nitride, ammonium plasma, hydrazine or hydrazine derivatives are preferred. For silicon boride boron compounds are preferred. For silicon carbide, alkanes or tetrachlorocarbon are preferred. For silicon carbide nitride, mixtures including alkanes, tetrachlorocarbon, ammonia and/or hydrazine are preferred.

A deposition process comprising a self-limiting process step and a subsequent self-limiting reaction is often referred to as atomic layer deposition (ALD). Equivalent expressions are molecular layer deposition (MLD) or atomic layer epitaxy (ALE). Hence, the process according to the present invention is preferably an ALD process. The ALD process is described in detail by George (Chemical Reviews 110 (2010), 111-131).

In the process according to the present invention a compound of general formula (I) is deposited on a solid substrate. The solid substrate can be any solid material. These include for example metals, semimetals, oxides, nitrides, and polymers. It is also possible that the substrate is a mixture of different materials. Examples for metals are tantalum, tungsten, cobalt, nickel, platinum, ruthenium, palladium, manganese, aluminum, steel, zinc, and copper. Examples for semimetals are silicon, germanium, and gallium arsenide. Examples for oxides are silicon dioxide, titanium dioxide, zirconium oxide, and zinc oxide. Examples for nitrides are silicon nitride, aluminum nitride, titanium nitride, tantalum nitride and gallium nitride. Examples for polymers are polyethylene terephthalate (PET), polyethylene naphthalene-dicarboxylic acid (PEN), and polyamides.

The solid substrate can have any shape. These include sheet plates, films, fibers, particles of various sizes, and substrates with trenches or other indentations. The solid substrate can be of any size. If the solid substrate has a particle shape, the size of particles can range from below 100 nm to several centimeters, preferably from 1 μm to 1 mm. In order to avoid particles or fibers to stick to each other while the compound of general formula (I) is deposited onto them, it is preferably to keep them in motion. This can, for example, be achieved by stirring, by rotating drums, or by fluidized bed techniques.

A particular advantage of the process according to the present invention is that the compound of general formula (I) is very versatile, so the process parameters can be varied in a broad range. Therefore, the process according to the present invention includes both a CVD process as well as an ALD process.

Depending on the number of sequences of the process according to the present invention performed as ALD process, films of various thicknesses are generated. Preferably, the sequence of depositing the compound of general formula (I) onto a solid substrate and decomposing the deposited compound of general formula (I) is performed at least twice. This sequence can be repeated many times, for example 10 to 500, such as 50 or 100 times. Usually, this sequence is not repeated more often than 1000 times. Ideally, the thickness of the film is proportional to the number of sequences performed. However, in practice some deviations from proportionality are observed for the first 30 to 50 sequences. It is assumed that irregularities of the surface structure of the solid substrate cause this non-proportionality.

One sequence of the process according to the present invention can take from milliseconds to several minutes, preferably from 0.1 second to 1 minute, in particular from 1 to 10 seconds. The longer the solid substrate at a temperature below the decomposition temperature of the compound of general formula (I) is exposed to the compound of general formula (I) the more regular films formed with less defects.

The process according to the present invention yields a silicon-containing film. The film can be only one monolayer of deposited compound of formula (I), several consecutively deposited and decomposed layers of the compound of general formula (I), or several different layers wherein at least one layer in the film was generated by using the compound of general formula (I). The film can contain defects like holes. These defects, however, generally constitute less than half of the surface area covered by the film. The film is preferably an inorganic film. In order to generate an inorganic film, all organic ligands have to be removed from the film as described above. The film can contain silicon oxide, silicon nitride, silicon boride, silicon carbide, or mixtures such as silicon carbide nitride, preferable the film contains silicon oxide and silicon nitride. The film can have a thickness of 0.1 nm to 1 μm or above depending on the film formation process as described above. Preferably, the film has a thickness of 0.5 to 50 nm. The film preferably has a very uniform film thickness which means that the film thickness at different places on the substrate varies very little, usually less than 10%, preferably less than 5%. Furthermore, the film is preferably a conformal film on the surface of the substrate. Suitable methods to determine the film thickness and uniformity are XPS or ellipsometry.

The film obtained by the process according to the present invention can be used in an electronic element or in the fabrication of an electronic element. Electronic elements can have structural features of various sizes, for example from 10 nm to 100 μm, such as 100 nm or 1 μm. The process for forming the films for the electronic elements is particularly well suited for very fine structures. Therefore, electronic elements with sizes below 1 μm are preferred. Examples for electronic elements are field-effect transistors (FET), solar cells, light emitting diodes, sensors, or capacitors. In optical devices such as light emitting diodes or light sensors the film according to the present invention serves to increase the reflective index of the layer which reflects light. An example for a sensor is an oxygen sensor, in which the film can serve as oxygen conductor, for example if a metal oxide film is prepared. In field-effect transistors out of metal oxide semiconductor (MOS-FET) the film can act as dielectric layer or as diffusion barrier.

It has surprisingly been found out that the process according to the present invention yields silicon-containing films with decreased etch-rates, i.e. films which are more stable in etch processes in comparison to silicon-containing films. This effect is particularly pronounced if etching is performed with hydrogen fluoride (HF) or ammonium fluoride ($NH_4F$). Such increased etching stability is of advantage in the chip production in which complex layer architectures are made by depositing films and selectively removing parts of them, for example by employing photo resists and shadow masks.

EXAMPLES

Thermogravimetric analysis was performed with about 20 mg sample. It was heated by a rate of 5° C./min in an argon stream.

Example 1

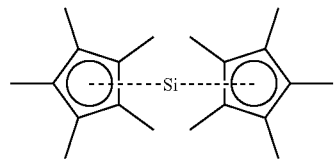

C-1

Figure 1:
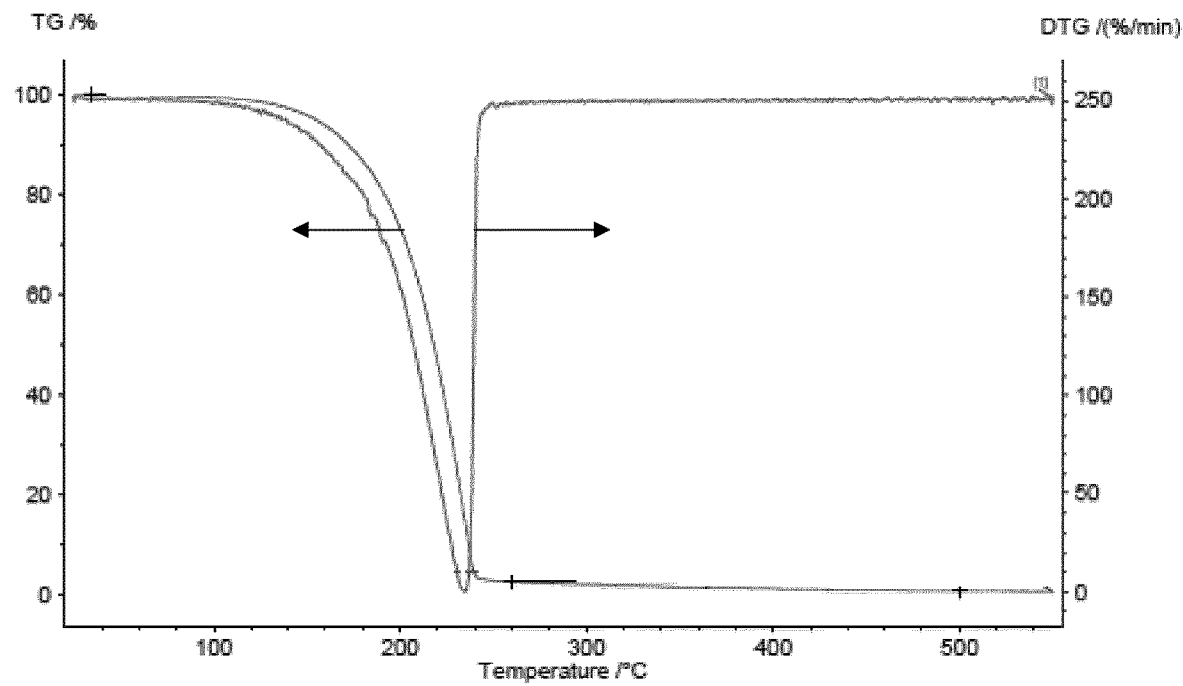
FIG. 1 shows the thermogravimetric analysis of compound C-1.

Compound C-1 was synthesized according to the procedure by Jutzi et al. in Angewandte Chemie International Edition, volume 25 (1986), page 164. The thermogravimetric analysis is depicted in FIG. 1. The mass loss at 250° C. is 97.27%.

Example 2

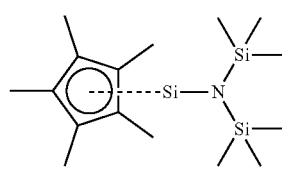

C-93

Figure 2:
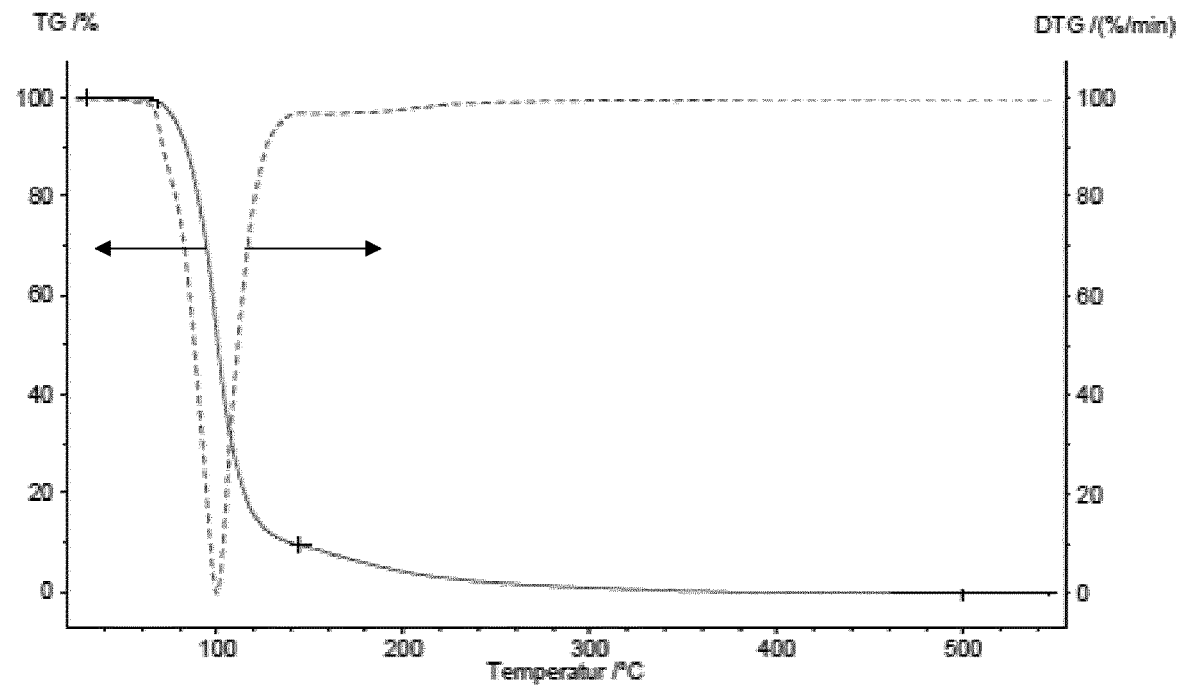
FIG. 2 shows the thermogravimetric analysis of compound C-93.

Compound C-93 was synthesized according to the procedure by Jutzi et al. in Chemical Communications 2006, page 3519. The thermogravimetric analysis under vacuum is depicted in FIG. 2. The mass loss at 150° C. is 89.89%.

Example 3

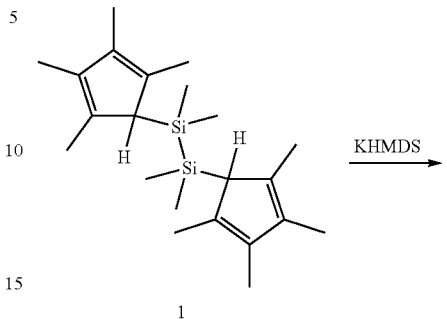

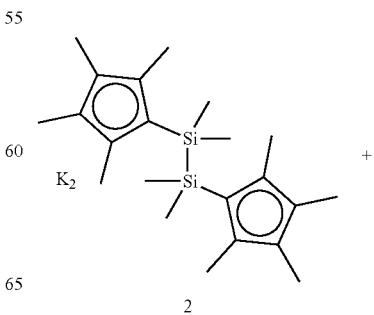

Compound 1 was prepared according to Kessler et al. Chemistry a European Journal, volume 19 (2013) page 6350-6357. A solution of potassium hexamethyldisilazane (KHMDS) 3.74 g (18.7 mmol) in $Et_2O$ (~80 ml) was added at room temperature to a stirred suspension of compound 1 (3.30 g, 9.20 mmol) in $Et_2O$ (~100 ml). The reaction mixture was stirred overnight to give a yellowish suspension. All volatiles were removed in vacuo. The remaining solid was washed twice with hexane (2×80 ml) and kept in vacuo for 1 h to afford 3.90 g (8.97 mmol) of compound 1 as a creamy solid.

-continued

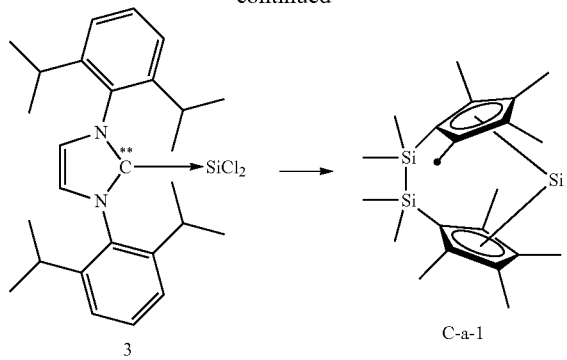

3

C-a-1

Compound 3 was prepared according to Ghadwal et al. Angewandte Chemie International Edition volume 48 (2009) page 5683-5686. THF (~15 ml) was added at room temperature to a stirred mixture of compound 3 (0.680 g, 1.39 mmol) and compound 2 (0.851 g, 1.96 mmol) placed in a 50-ml Schlenk flask. Stirring was continued overnight to afford a yellow suspension. All volatiles were removed in vacuo. The residue was extracted with hexane (~10 ml) and filtered. The solvent from the filtrate was removed in vacuo. Extraction with a cold pentane (~–60° C.) followed by filtration, concentration (to ~1 ml) and crystallization at –30° C. afforded C-a-1 co-crystallized with compound 1 and pentane (ratio 2:1:1) as colorless crystals (0.081 g, corresponding to 0.14 mmol of ansa-silicocene).

Figure 3:
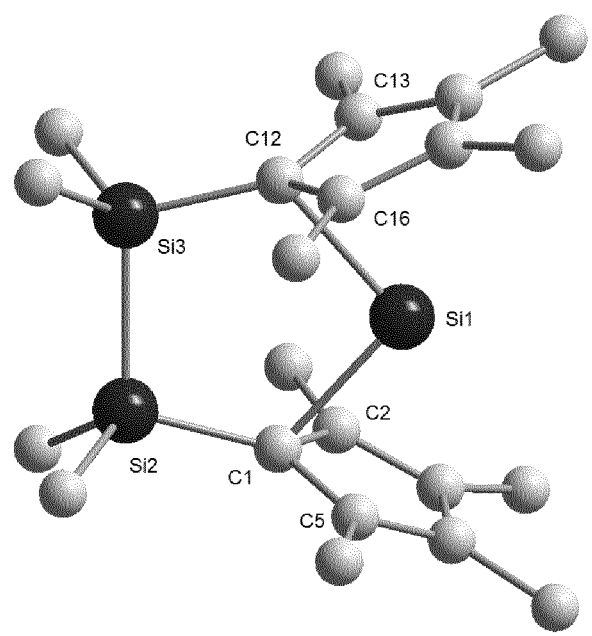
FIG. 3 shows the crystal structure of compound C-a-1.

Crystals suitable for X-ray analysis were grown from pentane after storing overnight at –30° C. The crystal structure of C-a-1 is shown in FIG. 3.

$^1$H NMR (400.13 MHz, 300 K, benzene-$d_6$): δ=0.51 (s, 12H, SiMe$_2$), 1.88 (s, 12H, Cp$^R$-Me), 2.22 (s, 12H, Cp$^R$-Me);

$^{13}$C{$^1$H}NMR (100.61 MHz, 300 K, benzene-$d_6$): δ=0.2 (s, Si—CH$_3$), 11.6 (s, Cp$^R$—CH$_3$), 15.2 (s, Cp$^R$—CH$_3$), 102.0, 124.2, 135.4 (Cp$^R$—C);

$^{29}$Si{$^1$H}NMR (79.49 MHz, 300 K, benzene-$d_6$): δ=–22.0 (SiMe$_2$), –268.2 (SiCp$^R$).

The invention claimed is:

1. A process, comprising depositing a compound of formula (I):

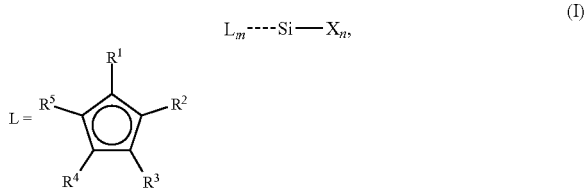

onto a solid substrate, wherein:
R1, R2, R3, R4, and R5 independently represent hydrogen, an alkyl group, an alkenyl group, an aryl group or a silyl group, wherein not more than three of R1, R2, R3, R4, and R5 are hydrogen,
X is an amine, an aryl group, an imine ligand, or an amidine ligand,
m is 1,
n is 1, and
Si is in the oxidation state +2.

2. The process according to claim 1, wherein three of R1, R2, R3, R4, and R5 are hydrogen and the remaining two are groups with branching at the atom which is attached to the cyclopentadienyl ring, or not more than two of R1, R2, R3, R4, and R5 are hydrogen.

3. The process according to claim 1, wherein R1, R2, R3, R4, R5 is methyl, ethyl, n-propyl, iso-propyl, n-butyl, iso-butyl, sec-butyl, tert-butyl, trimethylsilyl or triethylsilyl.

4. The process according to claim 1, wherein m is 2 and n is 0.

5. The process according to claim 1, wherein the compound of formula (I) is deposited from gaseous or aerosol phase onto the solid substrate.

6. The process according to claim 1, wherein the compound of formula (I) is deposited from solution onto the solid substrate.

7. The process according to claim 1, wherein the deposited compound of formula (I) is decomposed by removing all ligands L and X.

8. The process according to claim 1, wherein a sequence of depositing the compound of formula (I) onto a solid substrate and decomposing the deposited compound of formula (I) is performed at least twice.

9. A process, comprising forming a film of the compound of general formula (I), wherein:

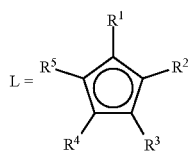

R1, R2, R3, R4, and R5 is hydrogen, an alkyl group, an alkenyl group, an aryl group or a silyl group, wherein not more than three of R1, R2, R3, R4, and R5 are hydrogen,
X is an amine, an aryl group, an imine ligand, or an amidine ligand,
m is 1,
n is 1, and
Si is in the oxidation state +2.

* * * * *